(12) United States Patent
Deng et al.

(10) Patent No.: US 12,222,396 B2
(45) Date of Patent: Feb. 11, 2025

(54) BATTERY INTERNAL TEMPERATURE INFORMATION PROCESSING METHOD, COMPUTER DEVICE, AND STORAGE MEDIUM

(71) Applicant: BYD COMPANY LIMITED, Guangdong (CN)

(72) Inventors: Linwang Deng, Shenzhen (CN); Xiaoqian Li, Shenzhen (CN); Tianyu Feng, Shenzhen (CN); Sijia Liu, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 390 days.

(21) Appl. No.: 17/780,911

(22) PCT Filed: Oct. 23, 2020

(86) PCT No.: PCT/CN2020/123264
§ 371 (c)(1),
(2) Date: May 27, 2022

(87) PCT Pub. No.: WO2021/103873
PCT Pub. Date: Jun. 3, 2021

(65) Prior Publication Data
US 2023/0025958 A1    Jan. 26, 2023

(30) Foreign Application Priority Data
Nov. 28, 2019   (CN) .......................... 201911190760.2

(51) Int. Cl.
*G01R 31/374*   (2019.01)
*B60R 16/033*   (2006.01)
(Continued)

(52) U.S. Cl.
CPC .......... *G01R 31/374* (2019.01); *B60R 16/033* (2013.01); *G01R 31/367* (2019.01);
(Continued)

(58) Field of Classification Search
CPC .............. G01R 31/374; G01R 31/3842; G01R 31/367; H01M 10/613; H01M 10/6554;
(Continued)

(56) References Cited

U.S. PATENT DOCUMENTS 7,660,694 B2    2/2010  Wu et al.
2009/0246606 A1*  10/2009  Shimizu ............ H01M 10/6569
                                           429/62
(Continued)

FOREIGN PATENT DOCUMENTS

CN    201974246 U    9/2011
CN    103503224 A    1/2014
(Continued)

OTHER PUBLICATIONS

Jiang et al., Method, device and intelligent terminal for determining internal temperature of battery module, 2019, CN110118617, English translation downloaded from Espacenet (Year: 2019).*
(Continued)

*Primary Examiner* — Lina Cordero
*Assistant Examiner* — Lyudmila Zaykova-Feldman

(57) ABSTRACT

A battery internal temperature information processing method, a computer device, and a storage medium that first acquire off-line testing data for off-line testing a battery module and construct an equivalent thermal network model from the off-line testing data, determine optimal model parameters of the equivalent thermal network model based on a multi-objective function fitting method; thereafter, a first battery internal temperature estimate of the battery of the vehicle at a first moment in actual operation of the
(Continued)

vehicle is determined, in turn, based on the acquired initial state vector values of the battery of the vehicle, first operational data at a first moment in actual operation of the vehicle, and an equivalent thermal network model including the optimal model parameters.

20 Claims, 5 Drawing Sheets

(51) Int. Cl.
    *G01R 31/367*     (2019.01)
    *G01R 31/3842*     (2019.01)
    *H01M 10/48*     (2006.01)
    *H01M 10/613*     (2014.01)
    *H01M 10/6554*     (2014.01)

(52) U.S. Cl.
    CPC ...... *G01R 31/3842* (2019.01); *H01M 10/482* (2013.01); *H01M 10/486* (2013.01); *H01M 10/613* (2015.04); *H01M 10/6554* (2015.04); *H01M 2220/20* (2013.01)

(58) Field of Classification Search
    CPC ............. H01M 10/482; H01M 10/486; H01M 2220/20
    See application file for complete search history.

(56) References Cited

U.S. PATENT DOCUMENTS

2020/0185796 A1* 6/2020 Stenvall ................... B60K 1/04
2021/0135307 A1* 5/2021 Bruneau ............. H01M 10/613

FOREIGN PATENT DOCUMENTS

| CN | 104462847 | A |   | 3/2015 |
|---|---|---|---|---|
| CN | 104865534 | A |   | 8/2015 |
| CN | 105206888 | A |   | 12/2015 |
| CN | 106104907 | A |   | 11/2016 |
| CN | 106872904 | A |   | 6/2017 |
| CN | 107069131 | A |   | 8/2017 |
| CN | 107192952 | A |   | 9/2017 |
| CN | 108647432 | A |   | 10/2018 |
| CN | 207937070 | U |   | 10/2018 |
| CN | 108983103 | A | * | 12/2018 |
| CN | 109188285 | A |   | 1/2019 |
| CN | 109799005 | A |   | 5/2019 |
| CN | 109921111 | A |   | 6/2019 |
| CN | 110118617 | A | * | 8/2019 |
| JP | 2014232649 | A |   | 12/2014 |
| JP | 2018170144 | A |   | 11/2018 |

OTHER PUBLICATIONS

Gan, A data processing method and device for power battery, 2019, CN108983103A, English translation downloaded from Espacenet (Year: 2019).*
International Search Report and Written Opinion for Application No. PCT/CN2020/123264, mailed on Jan. 28, 2021, 11 pages.
Li et al., "Liquid cooling structure design of cylindrical lithium ion power battery", Chinese Journal of Power Sources, Oct. 2018, vol. 42, No. 10, 4 pages [English Abstract].
Salameh et al., "Online Temperature Estimation for Phase change Composite—18650 Lithium Ion Cells Based Battery Pack", 2016 IEEE Applied Power Electronics Conference and Exposition (APEC), pp. 3128-3133.
Sun et al., "Online Internal Temperature Estimation for Lithium-Ion Batteries Based on Kalman Filter", Energies, ISSN 1996-1073, 2015, vol. 8, pp. 4400-4415.

* cited by examiner

BATTERY INTERNAL TEMPERATURE INFORMATION PROCESSING METHOD, COMPUTER DEVICE, AND STORAGE MEDIUM

CROSS-REFERENCE TO RELATED APPLICATIONS

This application is a National Phase Application of International Patent Application No. PCT/CN2020/123264, filed on Oct. 23, 2020, which is based on and claims priority to and benefits of Chinese Patent Application No. 201911190760.2, filed Nov. 28, 2019, entitled "Battery Interior Temperature Information Processing Method, Computer Device, and Storage Medium." The entire content of all of the above-referenced applications is incorporated herein by reference.

FIELD

The present disclosure relates to the technical field of battery temperature, and in particular to a battery internal temperature information processing method, a computer device, and a storage medium.

BACKGROUND

A battery that is the power of a new energy vehicle, there is a prevalent temperature rise phenomenon during charging and discharging, and heat generation and heat dissipation are not uniform inside the battery, and thus there is a temperature field distribution inside the battery, causing a large temperature difference between the inside and the outside of the battery, particularly more pronounced in high power demand applications. However, in practical battery thermal management, only the battery surface temperature can be measured in real time on the battery outer surface, it is not possible for the internal temperature of the battery to be measured in real-time, which has a significant impact on the performance of the battery and is directly related to the safety performance of the battery, so that battery thermal management, especially estimation of the internal temperature of the battery, has become one of the key and most challenging parts of battery management systems.

In the related art, a method of estimating the internal temperature of a battery based on electrochemical impedance spectroscopy is highly demanding on a test system, and thus, an actual vehicle cannot meet its test condition. The method of estimating the internal temperature of the battery based on a functional relationship between the internal temperature and the surface temperature is of no practical physical significance and is difficult to accommodate accurate calculation of the internal temperature of the battery under a variety of complex operating conditions. A method in which a battery heat transfer model in the related art equates a battery surface to one temperature point, The temperature is assumed to be the same at each point of the cell surface, The disadvantage of this solution is that since neither the internal construction nor the external shape of the battery is perfectly symmetrical, the internal to the individual face heat transfer paths of the battery are inconsistent, so that the temperature will vary at different locations on the surface of the battery, so that equivalence of the surface temperature as one point will result in a large error in the final estimated battery temperature.

SUMMARY OF THE INVENTION

Embodiments of the present disclosure provide a battery internal temperature processing method, a computer device, and a storage medium, which can accurately estimate the internal temperature of a battery in real-time, and can optimize the operating conditions of the battery based on the accurately estimated internal temperature of the battery in real-time, thereby improving the safety of the battery.

In a first aspect, an embodiment of the present disclosure provides a battery internal temperature information processing method including:
  obtaining an off-line testing data of battery modules after performing an off-line test under different off-line operating conditions in a constant temperature environment;
  obtaining multiple sets of initial parameters of the equivalent thermal network model according to the off-line testing data, and determining the optimal model parameters among the initial parameters of the equivalent thermal network model based on a multi-objective function fitting method;
  obtaining the initial state vector value of a battery of a vehicle and a first operating data of the battery of the vehicle at a first moment when the vehicle is actually operated;
  determining an estimate of the internal temperature of the battery at the first moment according to the initial state vector value, the first operating data and the equivalent thermal network model including the optimal model parameters of actual operation.

In a second aspect, an embodiment of the present disclosure provides a computer device, including a memory, a processor, and computer-readable instructions stored in the memory and executable on the processor, when the processor executes the computer-readable instructions the method for processing the internal temperature information of the battery is realized.

In a third aspect, an embodiment of the present disclosure provides a computer-readable storage medium, where the computer-readable storage medium stores computer-readable instructions, and when the computer-readable instructions are executed by a processor, implements the method for processing battery internal temperature information.

Embodiments of the present disclosure provide a battery internal temperature information processing method, a computer device, and a storage medium that first acquire off-line testing data for off-line testing a battery module and construct an equivalent thermal network model from the off-line testing data, determine optimal model parameters of the equivalent thermal network model based on a multi-objective function fitting method. Thereafter, a first estimated battery internal temperature of the battery of the vehicle at a first moment in the actual operation of the vehicle is determined, based on the acquired initial state vector values of the battery of the vehicle, first operational data at a first moment in the actual operation of the vehicle, and an equivalent thermal network model including the optimal model parameters. Embodiments of the present disclosure can accurately estimate the internal temperature of a battery in real time, which can optimize the operating conditions of the battery based on the accurately estimated internal temperature of the battery in real time and improve the safety of the battery.

Additional aspects and advantages of the disclosure will be set forth in part in the description which follows, and in part will be obvious from the description, or may be learned by practice of the disclosure.

DESCRIPTION OF THE FIGS.

In order to make technical solutions of the embodiment of the present invention more clearly, the accompanying drawings in conjunction with the description of the embodiments of the present invention will be briefly described. Apparently, the drawings in the following description are only some embodiments of the present invention, and other drawings may be obtained from the drawings without paying creative efforts to those skilled in the art.

DETAILED DESCRIPTION OF THE INVENTION

Reference will now be made in detail to embodiments of the present disclosure, examples of which are illustrated in the accompanying drawings, in which like or similar designations refer to like or similar elements or elements having like or similar functions throughout. The embodiments described below by reference to the drawings are examples for explaining the disclosure and are not to be construed as limiting the disclosure.

Figure 1:
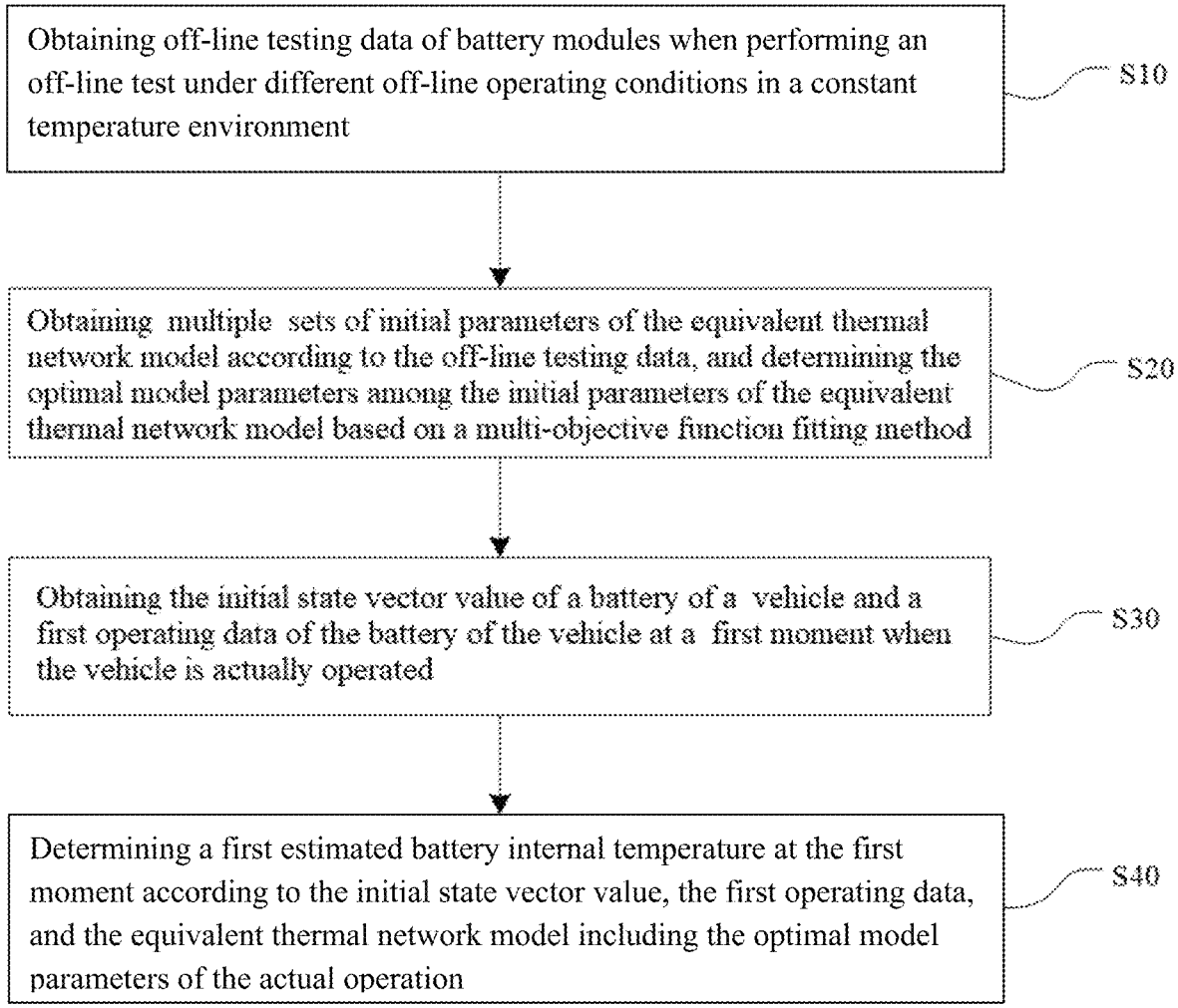
FIG. 1 is a flowchart of a battery internal temperature information processing method in an embodiment of the present disclosure.

Further, as shown in FIG. 1, there is provided a battery internal temperature information processing method including the following steps S10-S40.

S10, obtaining off-line testing data of battery modules when performing an off-line test under different off-line operating conditions in a constant temperature environment. The off-line operating conditions include constant current charging and discharging at different rates (wherein the different rates are preferably 0.1 C-3C), as well as dynamic conditions such as NEDC (New European Driving Cycle) and WLTC (World Light Vehicle Test Procedure). In the present disclosure, first, it is necessary to prepare a battery module for off-line testing, wherein the battery module includes a plurality of series/parallel connected cells and connection components connecting the cells to external components. A first temperature sensing device is arranged inside the cells of the battery module for detecting the internal temperature of the cells (the first temperature sensing device is preferably arranged inside the poles of the cells to ensure that it can measure the highest temperature throughout the cell). A second temperature sensing device is arranged on the surface of the cell for detecting the temperature of the surface of the cell, and a third temperature sensing device is provided on a cooling plate of a cooling system connected to the battery module for detecting the temperature of the off-line cooling plate. Understandably, the first, second, and third temperature sensing devices described above are preferably of the same type of sensing devices so that there is less discrepancy between the detected temperature data. When performing the off-line test, the battery module needs to be placed in a constant temperature environment (e.g., in an incubator, which provides a constant temperature environment of a determined temperature, and the temperature of the constant temperature environment is adjustable) to perform the off-line test at different off-line operating conditions, to obtain off-line testing data for performing off-line testing at different off-line operating conditions. Understandably, the off-line testing data includes equivalent circuit data for cells of the battery module, such as battery terminal voltage values and battery current values for cells of an equivalent circuit model of the battery module. The off-line testing data further includes off-line temperature data of the cells of the battery module. For example, the first temperature sensing device measures off-line testing internal temperatures inside the cells of the battery module and the second temperature sensing device measures off-line testing surface temperatures of the cell surfaces of the battery module. If the cell is square, the cell includes 6 surfaces, a second sensing device may be provided at each of the six surfaces of the cell at this moment, and a set of off-line testing surface temperatures taken at the same moment includes six off-line testing surface temperatures measured at each of the six surfaces of the cell. A third temperature sensing device measures an off-line cooling plate temperature of the cooling plate, an off-line ambient temperature of a constant temperature environment, and so on. Understandably, after obtaining the above off-line testing data, a real-time calculated first battery heat production rate in the charge and discharge processes of the cells of the battery module at different off-line operating conditions may be determined according to the battery terminal voltage value, the battery current value, and the off-line testing internal temperature of the above-mentioned off-line testing data. Understandably, the above charging and discharging processes may be a complete off-line operating condition or may be a segment of the entire off-line operating condition, i.e., a first battery heat production rate corresponds to each moment during the off-line charge-discharge operating condition.

Figure 2:
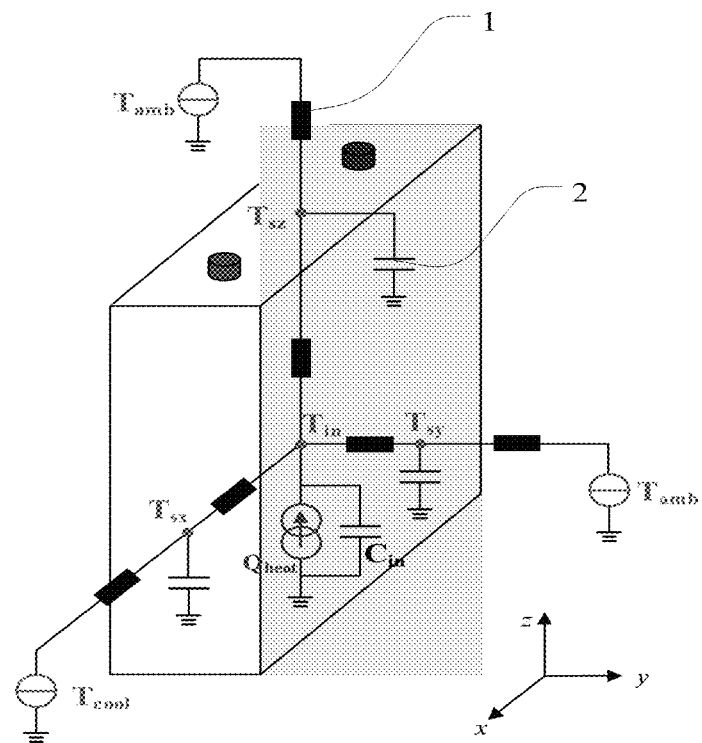
FIG. 2 is a schematic diagram illustrating a temperature calculation model inside a cell in accordance with an embodiment of the present disclosure.
Figure 3:
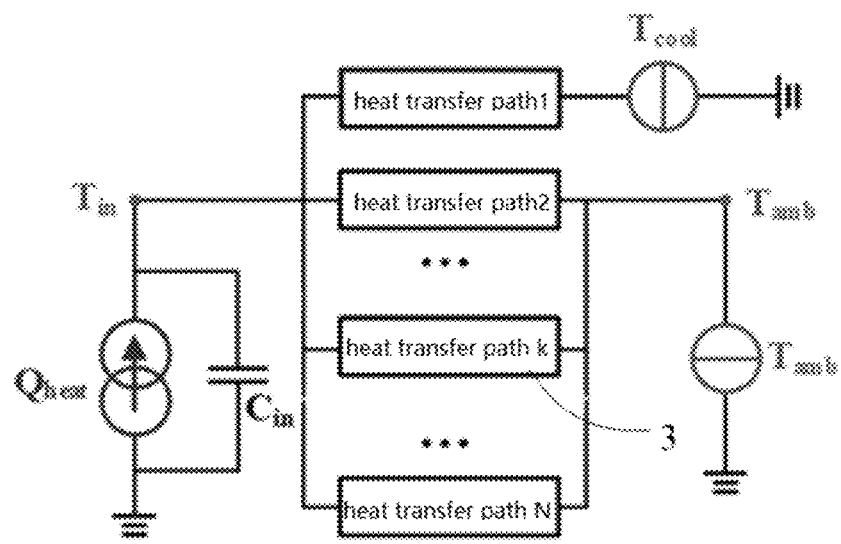
FIG. 3 is a schematic diagram illustrating an equivalent thermal network model of a cell in accordance with an embodiment of the present disclosure.
Figure 4:
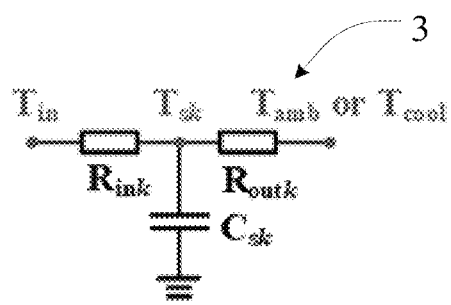
FIG. 4 is a structural diagram of a heat transfer path in an embodiment of the present disclosure.

Understandably, the heat transfer process from internal to external of the cell of the battery module described above may be equivalent to the heat transfer process from an internal center to the surface of the cell, and the process of thermal convection of the cell surface and the outside environment, which can be described by electrical network characteristics in terms of thermal characteristics, i.e., a thermal resistance can be equivalent to a resistance, a thermal capacity can be equivalent to a capacitance, a temperature can be equivalent to a voltage, and a heat production rate can be equivalent to a current source. Based on the equivalent correspondences described above, a cell internal temperature calculation model may be established as shown in FIG. 2. As shown in FIG. 2, $T_{in}$ denotes the temperature inside the cell of the battery module, $T_s$ represents the cell surface temperature of the battery module, $T_{amb}$ denotes the off-line ambient temperature of a constant temperature environment, $T_{cool}$ denotes the off-line cooling plate temperature ($T_{cool}=T_{amb}$ in case the cooling plate of the cooling system is not cooling), $Q_{heat}$ denotes the cell internal heat production rate (i.e. the first battery heat production rate described above), and $C_{in}$ denotes the cell internal equivalent thermal capacity. Noticeably, resistance 1 in FIG. 2 represents the thermal resistance between two temperature nodes (e.g., two temperature nodes at inside the cell and at the surface of the cell corresponding to each heat transfer path, or two temperature nodes at the surface of the cell and in the ambient environment), and capacitance 2 represents the equivalent thermal capacity of the corresponding node. Understandably, in FIG. 2, only heat transfer in directions respectively perpendicular to the three mutually perpendicular sides of the square cells (the positive directions of the three directions indicated as x, y, z in FIG. 2) are indicated, In fact, for square cells, heat transfer in the other three directions symmetrical to those in FIG. 2 (negative directions of the three directions x, y, z in FIG. 2) should be considered simultaneously, and the heat transfer in each direction may be considered as a heat transfer path, i.e. for square cells, heat transfer paths in six directions need to be considered. FIG. 3 and FIG. 4 are illustrated to further explain the heat transfer path of the above heat transfer. A structural schematic of the heat transfer path shown in FIG. 4 corresponds to one of the heat transfer paths 3 in the cell equivalent thermal network model shown in FIG. 3 (i.e. a corresponding heat transfer path k in FIG. 3, where k=1, 2, ..., n), i.e. each heat transfer path 3 in FIG. 3 is equivalent to a "T" type network of R-C-R shown in FIG. 4. As shown in FIG. 4, $R_{ink}$ represents the thermal resistance between the cell interior to the cell surface point corresponding to a heat transfer path, $R_{omtk}$ represents the thermal resistance between a cell surface point corresponding to a heat transfer path to the external environment, $C_{sk}$ denotes the equivalent thermal capacity of a cell surface point corresponding to a heat transfer path, and $T_{sk}$ denotes the cell surface temperature of a cell surface point corresponding to a heat transfer path. Understandably, the off-line temperature data of the cells of the battery module in the off-line testing data of the present disclosure are parameters corresponding to those in the cell equivalent thermal network model shown in FIG. 3 and FIG. 4 described above. In the present disclosure, the equivalent of a cell equivalent thermal network model to an electrical circuit model may be calculated in conjunction with electrical circuit simulation software to facilitate optimization of the parameters in the cell equivalent thermal network model, such that the cell equivalent thermal network model may be expressed without the need to establish complex system functional relationships, to simplify the subsequent calculation process.

S20, obtaining multiple sets of initial parameters of the equivalent thermal network model according to the off-line testing data, and determining the optimal model parameters among the initial parameters of the equivalent thermal network model based on a multi-objective function fitting method.

That is, based on the off-line testing data determined in step S10 above, initial parameters of an equivalent thermal network model (which corresponds to the cell equivalent thermal network model described above in FIG. 3) may be determined. In particular, each set of input data and output data of the equivalent thermal network model is first determined from the off-line testing data (a set of input data corresponds to a set of output data, and the corresponding input data and output data are each determined from the off-line testing data corresponding to a same moment in the charging and discharging process of the off-line operating conditions), the determined input data is input to the equivalent thermal network model, and output data output from the equivalent thermal network model and corresponding to the input data is obtained. Further, the multiple sets of initial parameters of the equivalent thermal network model are determined by the process described above. Preferably, the set of input data may include the first battery heat production rate determined in step S10 above, the off-line cooling plate temperature, and the off-line ambient temperature. Each set of output data includes an off-line test internal temperature and the off-line testing surface temperature, and each set of the initial parameters includes an equivalent thermal capacitance inside the cells in the equivalent thermal network model of the battery module, a thermal resistance from inside the cells to the surface points of the cells corresponding to the respective heat transfer paths, the thermal resistance of the surface points of the cells corresponding to the respective heat transfer paths to the ambient environment, and the equivalent thermal capacity of the cell's surface points corresponding to the respective heat transfer paths. The ambient environment here refers to the environment in which the cell or battery is located. For example, the cells of a battery module may be placed in a constant temperature environment, where the ambient environment is the constant temperature environment, or the equivalent thermal network model is applied to a vehicle's battery in the actual operation, where the ambient environment is the environment in which the vehicle's battery is actually located.

Understandably, after determining the initial sets of parameters for the equivalent thermal network model, a multi-objective function fitting method (including but not limited to a least-squares algorithm, a genetic algorithm, a particle swarm optimization algorithm, etc.) may be employed to determine the optimal model parameters from a plurality of sets of the initial parameters, that is, parameter finding can be performed by a multi-objective function fitting method (methods for parameter finding using a multi-objective function fitting method are known and not described herein). Finally, a set of optimal model parameters may be found, such that after inputting the input data into an equivalent thermal network model containing the optimal model parameters, the actual output data output from the equivalent thermal network model may best match the experimental test results.

S30, obtaining the initial state vector value of a battery of a vehicle and a first operating data of the battery of the vehicle at a first moment when the vehicle is actually operated. After the equivalent thermal network model containing the optimal model parameters is determined, the equivalent thermal network model can be applied to the battery of the vehicle (the battery of the vehicle refers to the battery cell of the vehicle without built-in temperature sensing equipment, so the temperature sensing equipment cannot measure the internal temperature of the battery of the vehicle). Based on the first operating data of the actual operation of the battery of the vehicle, the real-time internal temperature of the battery of the vehicle of the actual operation is determined, for example, as mentioned later, the first estimated value of the internal temperature of the battery when the vehicle is actually running at the first moment, the second estimated value of the internal temperature of the battery at the $N^{th}$ moment of the actual operation of the vehicle, etc.

Wherein the initial state vector value of the battery of the vehicle means an initial state vector value of the vehicle in an initial state in which the vehicle is not actually running (and the charging and discharging of the battery of the vehicle does not occur). The initial state vector value is a preset value, and the initial state vector values are associated with a real-time internal temperature of a battery of the vehicle when the vehicle is actually operating. In the present disclosure, the initial state vector values may have a certain error, and the present disclosure may perform stepwise feedback corrections of the initial state vector values with errors in subsequent steps (e.g., the posteriori values of the first state vector after the feedback correction of a first correction at a first moment), so that initial state vector values after the feedback correction (e.g., the a posteriori value of the first state vector, a posteriori value of the second state vector, etc.) are more and more accurate, and the real-time internal temperature of the vehicle's battery (e.g., the first estimated battery internal temperature, the second estimated battery internal temperature, etc.) is more and more accurate.

S40, determining a first estimated battery internal temperature at the first moment according to the initial state vector value, the first operating data, and the equivalent thermal network model including the optimal model parameters of the actual operation.

That is, the present disclosure may, in this step, make a stepwise feedback correction for this initial state vector value with error (which may, preferably, be feedback corrected with a Luenberger observer), thereby resulting in an increasing accuracy of the initial state vector values after the feedback correction, and an increasing accuracy of the real-time battery internal temperature of the vehicle, i.e. a more accurate internal temperature of the vehicle's battery can be obtained by the present disclosure. The acquired accurate battery internal temperature can be output to a BMS (BATTERY MANAGEMENT SYSTEM), the BMS may optimize the battery operation based on received internal battery temperatures (e.g., performing high battery temperature warnings, selecting operating currents based on the internal battery temperatures at low temperatures, etc.), ensure that the vehicle's battery operates within a safe temperature range, address flammable hazards, and improve safety and reliability of battery operation. The above-described embodiments of the present disclosure may determine the real-time battery internal temperature of the vehicle from the operational data (first operational data) of the actual operation of the vehicle and the equivalent thermal network model containing the optimal model parameters in case of failure of the temperature sensing device of the vehicle that collects the temperature data, thereby reducing the dependence on the effectiveness of the temperature sensing device of the vehicle that collects temperature data. Meanwhile, the present disclosure can make feedback corrections to the internal temperature of the battery of the vehicle, which can effectively eliminate the error effects on the real-time internal temperature of the battery caused by the error of the equivalent thermal network model and the error of the initial state vector value.

The present disclosure is based on a practical physical model (a circuit model equivalent to the cell equivalent thermal network model), takes into account of surface temperature non-uniformities caused by non-uniformities of the battery heat generation and dissipation, and establishes a plurality of heat transfer paths. While taking into account of heat exchange between a battery of a vehicle in the actual operation under a high-temperature condition and a cooling system, the heat transfer path between the battery and the cooling plate of the vehicle is added in the equivalent thermal network model (taking into account of the cooling plate temperature of the cooling system). Accordingly, the present disclosure fully takes into account of various factors of actual heating of the battery in the actual operation, so that the error between the battery internal temperature eventually estimated by the present disclosure and the battery actual temperature is smaller, and the battery internal temperature as well as the battery surface temperature can be more accurately calculated. The present disclosure can accurately estimate the internal temperature of the battery, and can optimize the operating conditions of the battery based on the accurately estimated internal temperature of the battery, thereby improving the safety of the battery.

In an embodiment, in step S10, the obtaining the off-line testing data of the battery module when performing the off-line test under different off-line operating conditions of a constant temperature environment, includes:

obtaining off-line temperature data and equivalent circuit data of the battery module under different off-line operating conditions for performing the off-line test; wherein, the off-line temperature data includes an off-line testing internal temperature (corresponding to $T_{in}$ shown in FIGS. 2, 3 and 4), an off-line testing surface temperature (corresponding to $T_{sx}$, $T_{sY}$ or $T_{sz}$ shown in FIG. 2, $T_{sk}$ shown in FIG. 4), an off-line cooling plate temperature (corresponding to $T_{cool}$ shown in FIGS. 2, 3 and 4), and an off-line ambient temperature (corresponding to $T_{amb}$ shown in FIGS. 2, 3 and 4) of the constant temperature environment in which the battery module is subjected to the off-line test. The internal temperature of the off-line test is measured by a first temperature sensing device arranged inside the cell of the battery module, the off-line testing surface temperature is measured by a second temperature sensing device arranged on the surface of the cells of the battery module, the off-line cooling plate temperature is measured by a third temperature sensing device on a cooling plate arranged on a cooling system connected to the battery module, and the equivalent circuit data includes the battery terminal voltage value and the battery current value of the battery module (which may be measured in real time during an off-line test).

That is, in this embodiment, the off-line operating conditions include constant current charging and discharging at different rates (where the different rates are preferably 0.1-3C) and dynamic conditions such as NEDC, WLTC, and the like. After obtaining the off-line testing data, a real-time calculated first battery heat production rate of a cell of the battery module during charging and discharging at different off-line operating conditions may first be determined from the battery terminal voltage value, the battery current value and the off-line testing internal temperature in the off-line testing data. Initial parameters of the equivalent thermal network model are then determined from the first battery heat production rate and off-line testing data described above. Further, after determining the initial sets of parameters of the equivalent thermal network model, using a multi-objective function fitting method (e.g., a least-squares algorithm, a genetic algorithm, a particle swarm optimization algorithm, etc.) to determine optimal model parameters of the initial sets of parameters. From the equivalent thermal network model including the optimal model parameters, a first estimated battery internal temperature of a battery of the vehicle at a first moment is determined at a first moment when the vehicle is actually operating.

In an embodiment, in step S10, after obtaining the off-line temperature data and off-line testing data of the battery module, the method includes:

obtaining a first open circuit voltage and a first temperature coefficient of the battery module from a database. Understandably, the first open circuit voltage and the first temperature coefficient are each related to a SOC (State of Charge) value of the battery. Thus, as long as the SOC value of the battery module is determined, both the first open circuit voltage and the first temperature coefficient may be determined and stored in the database in association with the SOC values of the cells of the battery module; and grouping and inputting the battery terminal voltage value, the battery current value and the off-line testing internal temperature into a preset first heat production rate model, and obtaining a first battery heat production rate of the battery module output from the first heat production rate model under different off-line operating conditions; wherein, a set of the battery terminal voltage value, the battery current value, and the off-line testing internal temperature is defined as the battery terminal voltage value, the battery current value and the off-line testing internal temperature corresponding to a same moment under a same off-line operating condition.

That is, after obtaining the above-mentioned off-line testing data, a real-time calculated first battery heat production rate of the cells of the battery module during charging and discharging at different off-line operating conditions may first be determined from the battery terminal voltage value, the battery current value and the off-line testing internal temperature in the above-mentioned off-line testing data. Understandably, each instance of charge and discharge during off-line operation corresponds to a first battery heat production rate.

Figure 5:
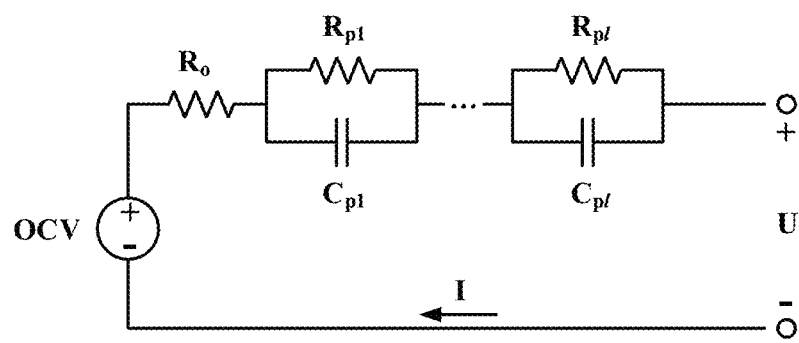
FIG. 5 is a structural diagram of an equivalent circuit model in an embodiment of the present disclosure.

Further, the electrical characteristics of the cells of the battery module may be described by the equivalent circuit model shown in FIG. 5, ($R_0$ and $R_{Pl}$ shown in FIG. 5 may be equivalent to the thermal resistance of the cells of the battery module and $C_{Pl}$ may be equivalent to the thermal capacitance of the cells of the battery module). In one embodiment, the first thermal yield model is:

$$Q_{heat1} = (OCV(SOC_1) - U_1) \times I_1 + I_1 T_1 \frac{dOCV}{dT}(SOC_1).$$

Wherein:

the $Q_{heat1}$ is the first battery heat production rate of the battery module under off-line operating conditions, that is, the internal heat production rate of the cells of the battery module. The $(OCV(SOC_1)-U_1) \times I_1$ denotes the thermal polarization moiety which is the sum of ohmic polarization and concentration polarization;

$$I_1 T_1 \frac{dOCV}{dT}(SOC_1)$$

stands for reversible heat of reaction, i.e. entropic heating; and the $OCV(SOC_1)$ is the first open circuit voltage of the battery module. The $OCV(SOC_1)$ associated with SOC values of the cells of the battery module is stored in an OCV-SOC table in a BMS or other database, and the $OCV(SOC_1)$ of the battery module may be obtained by querying the SOC values corresponding to the cells of the battery module from the OCV-SOC table.

The $U_1$ is the battery terminal voltage value of the battery module, and the $U_1$ represents the voltage of the cells of the battery module during charging and discharging, which can be actually measured by the voltage measurement device during off-line testing.

The $I_1$ is the battery current value of the battery module. The $I_1$ represents the current of a cell of a battery module during charging and discharging, which can be actually measured by a current measuring device during off-line testing, and the $I_1$ is negative when charging and positive when discharging.

The $T_1$ is the off-line testing internal temperature, which can be measured by a first temperature sensing device.

The $$\frac{dOCV}{dT}(SOC_1)$$

is the first temperature coefficient of the battery module, which is stored in a BMS or other database in association with the SOC values of the cells of the battery module, and the $$\frac{dOCV}{dT}(SOC_1)$$

of the battery module may be obtained by querying the SOC values corresponding to the cells of the battery module from the BMS or other database.

In an embodiment, the step S20, the obtaining the multiple sets of initial parameters of the equivalent thermal network model according to the off-line testing data, and determining the optimal model parameters among the initial parameters of the equivalent thermal network model based on a multi-objective function fitting method further includes:

Obtaining input data and output data of an equivalent thermal network model, and associating the input data with the output data corresponding to the same moment (which may refer to a preset moment in an off-line test process) under the same off-line operating condition; the input data include the first battery heat production rate (corresponding to $Q_{heat1}$ in the first heat production rate model), the off-line cooling plate temperature (corresponding to $T_{cool}$ shown in FIGS. 2, 3, and 4), and the off-line ambient temperature (corresponding to $T_{amb}$ shown in FIGS. 2, 3, and 4); and the output data include the off-line testing internal temperature (corresponding to $T_{in}$ shown in FIGS. 2, 3 and 4) and the off-line testing surface temperature (corresponding to $T_{sx}$, $T_{sy}$ or $T_{sz}$ shown in FIG. 2, $T_{sk}$ shown in FIG. 4);

Inputting the input data into the equivalent thermal network model equivalent thermal network model, and taking the output data associated with the input data input into the equivalent thermal network model as the output of the equivalent thermal network model to obtain initial parameters of the equivalent thermal network model, a set of the initial parameters includes the equivalent thermal capacity inside the cell of the battery module in the equivalent thermal network model (i.e. $C_{in}$ shown in FIG. 2), a thermal resistance from the inside of the cell to the surface point of the cell corresponding to each heat transfer path (i.e., $R_{ink}$ shown in FIG. 4), a thermal resistance from the cell surface point corresponding to each heat transfer path to the external environment (i.e., $R_{outk}$ shown in FIG. 4), and an equivalent thermal capacity of the cell surface point corresponding to each heat transfer path (i.e., $C_{sk}$ shown in FIG. 4);

Determining a set of optimal model parameters among the initial parameters based on a multi-objective function fitting method; and the multi-objective function fitting method includes one or more of a least-squares algorithm, a genetic algorithm, and a particle swarm optimization algorithm; and Performing parameter finding by a multi-objective function fitting method. The final search results in a set of optimal model parameters such that, after inputting the input data into an equivalent thermal network model containing the optimal model parameters (the optimal model parameters of the equivalent thermal network model are no longer altered during subsequent calculations), the actual output data output from the equivalent thermal network model best matches the experimental test results.

In an embodiment, in step S30, the obtaining the initial state vector value of a battery and a first operating data of the battery of the vehicle at a first moment when the vehicle is actually operated further includes:

Obtaining the initial state vector value of the battery of the vehicle at an initial moment of the actual operation from a database, an initial state vector value of the battery of the vehicle means an initial state vector value of the vehicle in an initial state where the vehicle is not actually running (no charging and discharging of the battery of the vehicle occurs), where the initial state vector value is a preset value, and the initial state vector value is associated with a real-time internal temperature of a battery of the vehicle when the vehicle is actually operating, the initial state vector value in the present disclosure may have some error, and the present disclosure may make stepwise feedback corrections to the erroneous initial state vector value in subsequent steps; and Obtaining a first operating data at the first moment of the actual operation, wherein the first operating data includes a first battery surface temperature, a first cooling plate temperature, a first ambient temperature, a first voltage value and a first current value; the first battery surface temperature is measured by a fourth temperature sensing device provided on the battery surface of the vehicle, and the first cooling plate temperature is measured by a fifth temperature sensing device provided on the cooling plate of the vehicle cooling system connected to the battery of the vehicle. Understandably, the fourth and fifth temperature sensing devices described above are provided as the same type of sensing devices (preferably the same as the first temperature sensing device described above) so that there is less error between the detected temperature data. The first ambient temperature is the temperature of the environment at the first moment of the actual operation, the first voltage value is the voltage value of the battery of the vehicle at the first moment of the actual operation, and the first current value is the current value of the battery of the vehicle at the first moment of the actual operation. Understandably, the above-mentioned first voltage value and first current value may be measured in real-time at each moment during the actual operation of the vehicle. In this embodiment, the cell internal temperature calculation model shown in FIG. 2 may also be useful in the heat transfer process of a vehicle's battery, during the actual operation of the battery of the vehicle, as shown in FIG. 2, $T_{in}$ represents the internal battery temperature of the vehicle, $T_s$ represents the above-mentioned first battery surface temperature, $T_{amb}$ represents the first ambient temperature of the environment in which the vehicle actually operates at the first moment, $T_{cool}$ represents the first cooling plate temperature ($T_{cool}=T_{amb}$ in the case where the cooling plate of the cooling system is not cooled), $Q_{heat}$ represents the internal battery heat production rate of the vehicle.

Figure 6:
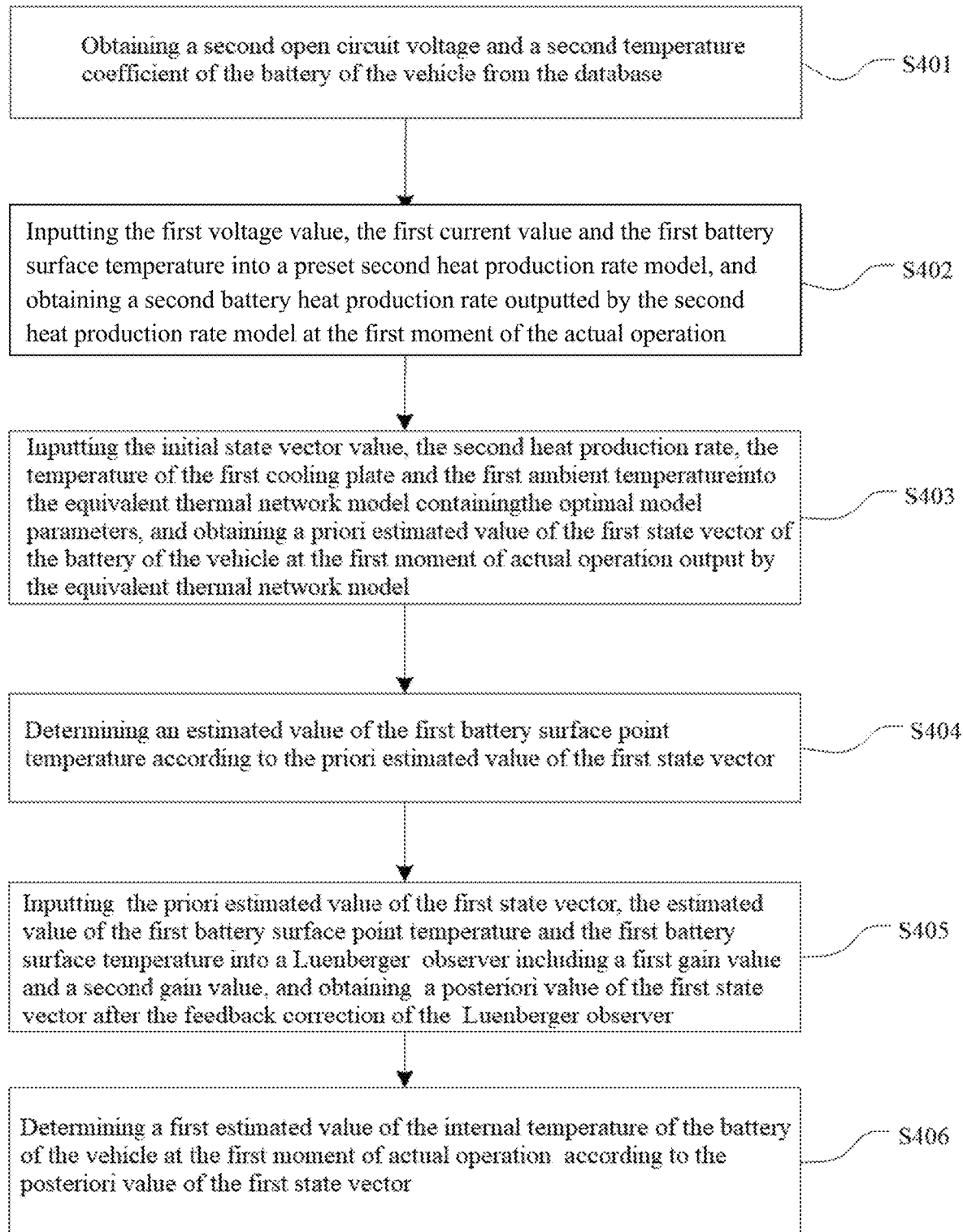
FIG. 6 is a flowchart of step S40 of a battery internal temperature information processing method in an embodiment of the present disclosure.

In an embodiment, as shown in FIG. 6, in step S40, the determining an estimate of the internal temperature of the battery at the first moment according to the initial state vector value, the first operating data and the equivalent thermal network model including the optimal model parameters of actual operation further includes:

S401, obtaining a second open circuit voltage and a second temperature coefficient of the battery of the vehicle from the database. Understandably, the second open circuit voltage and the second temperature coefficient are both related to the SOC value of the battery of the vehicle, so as long as the SOC value of the battery of the vehicle is determined, the second open circuit voltage and the second temperature coefficient can be determined accordingly, and both the second open circuit voltage and the second temperature coefficient of the battery of the vehicle are stored in the database in association with the SOC value of the battery. Therefore, the second open circuit voltage and the second temperature coefficient at the current moment can be determined according to the real-time SOC value of the battery of the vehicle (in the actual operation process, the real-time SOC value of the battery of the vehicle can be measured).

S402: inputting the first voltage value, the first current value and the first battery surface temperature into a preset second heat production rate model, and obtaining a second battery heat production rate outputted by the second heat production rate model at the first moment of the actual operation. Understandably, the first moment in the charging and discharging process of the actual operation of the vehicle corresponds to a second heat production rate of the battery in real time. Preferably, the second heat production rate model is:

$$Q_{heat\,2k} = (OCV(SOC_{2k}) - U_{2k}) \times I_{2k} + I_{2k}T_{2k}\frac{dOCV}{dT}(SOC_{2k}).$$

Wherein:

The k is the $k^{th}$ moment when the vehicle's battery is actually operating, $0 \leq k \leq N$ (N refers to the $N^{th}$ moment when the vehicle is actually operating), and k is an integer. At the initial moment of the actual operation of the vehicle, k=0; at the first moment of the actual operation of the vehicle, k=1; and at the $N^{th}$ moment of the actual operation of the vehicle, k=N.

The $Q_{heat2k}$ is the battery heat production rate of the vehicle's battery at the $k^{th}$ moment, that is, the internal heat production rate of the battery of the vehicle. (OCV) $(SOC_{2k})-U_{2k}) \times I_{2k}$ denotes the thermal polarization moiety which is the sum of ohmic polarization and concentration polarization, and $$I_{2k}T_{2k}\frac{dOCV}{dT}(SOC_{2k})$$

stands for reversible heat of reaction, i.e. entropic heating.

The ($OCV(SOC_{2k})$) is the second open circuit voltage of the vehicle's battery. The $OCV(SOC_{2k})$ is stored in association with the SOC value of the battery of the vehicle in an OCV-SOC table of a preset storage area of the vehicle, and the $OCV(SOC_{2k})$ of the battery module may be obtained by querying the SOC value corresponding to the battery of the vehicle from the OCV-SOC table.

The $U_{2k}$ is the voltage value of the vehicle's battery at the $k^{th}$ moment. $U_{2k}$ denotes the voltage of the vehicle's battery during charging and discharging of the actual operation, which can be actually measured by the voltage measurement device during the actual operation.

The $I_{2k}$ is the current value of the vehicle's battery at the $k^{th}$ moment. $I_{2k}$ represents the current of the vehicle's battery during charging and discharging in the actual operation, which can be actually measured by the current measuring device during the actual operation, and $I_{2k}$ is negative when charging and positive when discharging.

The $T_{2k}$ is the battery surface temperature of the vehicle's battery at the $k^{th}$ moment. The $T_{2k}$ can be measured by a fourth temperature sensing device provided on the surface of the battery of the vehicle. Understandably, In a second heat production rate model, with respect to $(OCV(SOC_{2k})-U_{2k}) \times I_{2k}$, the heat transfer, $$I_{2k} T_{2k} \frac{dOCV}{dT}(SOC_{2k}),$$

has little effect on the second battery heat production rate. Therefore, in the present embodiment, in the process of actually calculating the second battery heat production rate, the battery surface temperature of the battery surface of the vehicle can be equivalently replaced with the battery internal temperature (which cannot be measured because the temperature sensing device is not provided inside the battery in the battery of the vehicle), and the second battery heat production rate can be calculated.

$$\frac{dOCV}{dT}(SOC_{2k})$$

is the second temperature coefficient of the battery of the vehicle. The second temperature coefficient is stored in a BMS or other database in association with the SOC value of the battery of the vehicle, and $$\frac{dOCV}{dT}(SOC_{2k})$$

of the battery can be obtained by querying the SOC value corresponding to the battery of the vehicle from the BMS or other databases. According to the above, at the first moment of the actual operation of the vehicle, k=1, at this moment, the second heat production rate model is:

$$Q_{heat21} = (OCV(SOC_{21}) - U_{21}) \times I_{21} + I_{21} T_{21} \frac{dOCV}{dT}(SOC_{21}).$$

Wherein the first voltage value $U_{21}$ the first current value $I_{21}$, the first battery surface temperature $T_{21}$, the second temperature coefficient $$\frac{dOCV}{dT}(SOC_{21})$$

and the second open circuit voltage $OCV(SOC_{21})$ are all known, therefore, the second battery heat production rate $Q_{heat21}$ corresponding to the first moment can be acquired from the second heat production rate model described above.

S403, inputting the initial state vector value, the second heat production rate, the temperature of the first cooling plate, and the first ambient temperature into the equivalent thermal network model containing the optimal model parameters, and obtaining a priori estimated value of the first state vector of the battery of the vehicle at the first moment of the actual operation output by the equivalent thermal network model.

In this embodiment, the battery state space equation may first be established as follows:

$$X_{state}^{time}(k) = f(X_{state}(k-1)), Q_{heat}(k), T_{amb}(k), T_{cool}(k))$$

$$Y^{mea}(k) = g(X_{state}^{time}(k))$$

Wherein: $X_{state}(k) = [T_{in}, T_{s1} \sim T_{sn}]^T$, $X_{state}^{time}(k)$ represents a priori estimated value of the battery state vector at the $k^{th}$ moment of the actual operation $X_{state}(k-1)$, represents a posteriori value of the battery state vector at the $(k-1)^{th}$ moment of the actual operation, and k is an integer. At the initial moment of the operation, k=0; at the first moment of the actual operation of the vehicle, k=1; at the $N^{th}$ moment of the actual operation of the vehicle, k=N; and $X_{state}(0)$ is the initial state vector value. $f(\cdot)$ corresponds to the equivalent thermal network model shown in FIG. 3, that is, $f(\cdot)$ can be described by the equivalent thermal network model shown in FIG. 3. $Y^{mea}(k)$ is an estimated value of the temperature of a surface point of the battery of the vehicle, which can be described as a $g(\cdot)$ function of a priori estimated value $X_{state}^{time}(k)$ of the state vector of the above mentioned battery. $Q_{heat}(k)$ is the heat production rate of the battery of the vehicle (such as the above-mentioned second battery heat production rate or the third battery heat production rate mentioned later). $T_{amb}(k)$ is the temperature of the environment in which the vehicle actually operates (such as the above-mentioned first ambient temperature or the second ambient temperature mentioned later), and $T_{cool}(k)$ is the cooling temperature of the cooling plate of the cooling system of the vehicle (such as the above-mentioned first cooling plate temperature or the second cooling plate temperature mentioned later).

Afterwards, at the first moment when the vehicle is actually operating, k=1. At this moment, it is known from the above battery state space equation that:

$$X_{state}^{time}(1) = f(X_{state}(0), Q_{heat}(1), T_{amb}(1), T_{cool}(1)).$$

Wherein the initial state vector values $X_{state}(0)$, the second battery heat production rate $Q_{heat}(1)$ (at the first moment when the vehicle is actually operating), the first cooling plate temperature $T_{cool}(1)$, and the first ambient temperature $T_{amb}(1)$ are all known, thus a priori estimate $X_{state}^{time}(1)$ state of a first state vector at the first moment can be derived.

S404, determining an estimated value of the first battery surface point temperature according to the priori estimated value of the first state vector, that is, at the first moment of actual operation, k=1. At this moment $Y^{mea}(1) = g(X_{state}^{time}(1))$, since $X_{state}^{time}(1)$ is known, the first estimated battery surface point temperature value $Y^{mea}(1)$ at the first moment can be calculated.

S405, inputting the priori estimated value of the first state vector, the value of the first estimated battery surface point temperature, and the first battery surface temperature into a Luenberger observer including a first gain value and a second gain value, and obtaining a posteriori value of the first state vector after the feedback correction of the Luenberger observer.

Preferably, the Luenberger observer is:

$$X_{state}(k) = X_{state}^{time}(k) + K_p \cdot (T_s^{measure}(k) - Y^{mea}(k)) + K_1 \cdot \sum_{i=1}^{k}(T_s^{measure}(i) - Y^{mea}(i)).$$

Wherein:

The k is the $k^{th}$ moment of the actual operation of the battery of the vehicle, $0 \leq k \leq N$, and k is an integer; at the initial moment of the actual operation of the vehicle, k=0; at the first moment of the actual operation of the vehicle, k=1; and at the $N^{th}$ moment of the actual operation of the vehicle time, k=N;

The $X_{state}$ (k) is the posteriori value of the state vector of the battery of the vehicle at the $k^{th}$ moment;

The $X_{state}^{time}$(k) is the a priori estimated value of the state vector of the battery of the vehicle at the $k^{th}$ moment;

The $K_p$ is the first gain value; $K_p$ is preset in the Luenberger observer;

The $K_1$ is the second gain value; $K_1$ is preset in the Luenberger observer;

The $T_s^{measure}$(k) is the battery surface temperature of the vehicle at the $k^{th}$ moment; $T_s^{measure}$(k) is obtained by real-time measurement at the $k^{th}$ moment by a fourth temperature sensing device disposed on the battery surface of the vehicle.

The $Y^{mea}$(k) is the estimated value of the battery surface point temperature of the vehicle at the $k^{th}$ moment;

$T_s^{measure}$ is the battery surface temperature of the vehicle at the $i^{th}$ moment $1 \leq i \leq k$, and i is an integer; $T_s^{measure}$(i) is obtained by real time measurement at the $i^{th}$ moment by the fourth temperature sensing device disposed on the battery surface of the vehicle.

$Y^{mea}$(i) is the estimated value of the battery surface point temperature of the vehicle at $i^{th}$ moment.

Afterwards, at the first moment when the vehicle is actually operating, k=1. At this moment, it can be known from the above-mentioned Luenberger observer:

$X_{state}(1) = X_{state}^{time}(1) + K_p \cdot (T_s^{measure}(1) - Y^{mea}(1)) + K_1 \cdot (T_s^{measure}(1) - Y^{mea}(1))$ At this moment, in the above step S403, a priori estimated value $X_{state}^{time}$(1) of the first state vector at the first moment is known; in the above step S404, the first estimated battery surface point temperature $Y^{mea}$(1) at the first moment is known; $K_1$ and $K_p$ are preset in the Luenberger observer; and $T_s^{measure}$(1) can be measured in real time at the first moment by the fourth temperature sensing device arranged on the surface of the battery of the vehicle. At this moment, the posteriori value $X_{state}$(1) of the first state vector of the battery of the vehicle at the first moment can be calculated.

S406, determining a first estimated value of the internal temperature of the battery of the vehicle at the first moment of the actual operation according to the posteriori value of the first state vector. As can be seen from the above, $X_{state}(k)=[T_{in}, T_{s1} \sim T_{sn}]^T$, therefore, according to the posteriori value $X_{state}$ (1) of the first state vector and the battery surface temperature ($T_{s1} \sim T_{sn}$) of the vehicle, the first estimated battery internal temperature $T_{in}$ of the vehicle's battery at the first moment of the actual operation can be determined.

In an embodiment, after the step S40, that is, according to the initial state vector value, the first operating data, and the equivalent thermal network model including the optimal model parameters, after determining the first estimated battery internal temperature at the first moment of the actual operation of the vehicle, further includes:

Obtaining the second operating data of the battery of the vehicle at the $N^{th}$ moment when the vehicle actually runs and the posteriori value of the second state vector at the $(N-1)^{th}$ moment; and N is a positive integer greater than or equal to 2; and Determining the second estimated battery internal temperature at the $N^{th}$ moment of the battery of the vehicle during the actual operation according to the posteriori value of the second state vector at the $(N-1)^{th}$ moment, the second operating data, and the equivalent thermal network model including the optimal model parameters the $N^{th}$ moment.

Understandably, in the present disclosure, the internal temperature of the battery of the vehicle can be feedback corrected through the posteriori value of the state vector, and then the internal temperature of the battery after the feedback correction is further corrected in the actual operation (for example, at the $N^{th}$ moment, perform feedback correction on the posteriori value of the second state vector at the $(N-1)^{th}$ moment, and obtain the posteriori value of the second state vector after the feedback correction). According to the posteriori value of the second state vector, it can be determined that the second estimated battery internal temperature of the at the $N^{th}$ moment of the battery of the vehicle during actual operation. That is, the temperature inside the battery is always in an iterative correction process during the actual operation of the vehicle. As the iterative process proceeds, the internal temperature of the battery is estimated. The value will be more and more accurate. In this way, the errors of the real-time internal temperature of the battery caused by the error of the equivalent thermal network model and the error of the initial state vector value can be effectively eliminated.

In one embodiment, the second operating data includes a second battery surface temperature, a second cooling plate temperature, a second ambient temperature, a second voltage value and a second current value. The second battery surface temperature is determined by the temperature of the second cooling plate measured by the fourth temperature sensing device, and the temperature of the second cooling plate is measured by the fifth temperature sensing device. The second ambient temperature is the temperature of the environment in which the vehicle actually runs at the $N^{th}$ moment, the second voltage value is the voltage value of the battery of the vehicle at the $N^{th}$ moment of actual operation, and the second current value is the current value of the battery of the vehicle at the $N^{th}$ moment of the actual operation. Understandably, the above-mentioned second voltage value and second current value may be measured in real time at the $N^{th}$ moment during the actual operation of the vehicle. In an embodiment, the step is determined according to the a posteriori value of the second state vector at the $(N-1)^{th}$ moment, the second operating data, and the equivalent thermal network model including the optimal model parameters. determining the estimated value of the second battery internal temperature of the battery of the vehicle at the $N^{th}$ moment of actual operation, including:

Inputting the second voltage value, the second current value, and the second battery surface temperature into the second heat production rate model, and obtaining a third battery heat production rate of the battery of the vehicle at the $N^{th}$ moment in the actual operation outputted from the second heat generation rate model. Understandably, the $N^{th}$ moment in the charging and discharging process of the actual operation of the vehicle corresponds to the third battery heat production rate in real time. According to the above second heat production rate model, at the $N^{th}$ moment of the actual operation of the vehicle, k=N, at this moment, the second heat production rate model is:

$$Q_{heat2N} = (OCV(SOC_{2N}) - U_{2N}) \times I_{2N} + I_{2N}T_{2N}\frac{dOCV}{dT}(SOC_{2N}).$$

Wherein, the second voltage value $U_{2N}$ the second current value $I_{2N}$ the second battery surface temperature $T_{2N}$, the second temperature coefficient $$\frac{dOCV}{dT}(SOC_{2N}),$$

and the second open circuit voltage $OCV(SOC_{2N})$ are all known. Therefore, the $N^{th}$ heat production rate model can be obtained according to the above-mentioned second heat production rate model. The third battery heat production rate $Q_{heat2N}$ of corresponds to the $N^{th}$ moment.

The posteriori value of the second state vector at the $(N-1)^{th}$ moment, the third battery heat production rate, the second cooling plate temperature, and the second environment temperature are input into the equivalent thermal network model including the optimal model parameters. In the equivalent thermal network model, the a priori estimated value of the second state vector of the battery of the vehicle at the $N^{th}$ moment of the actual operation output from the equivalent thermal network model is obtained. According to the above battery state space equation, at the $N^{th}$ moment of the actual operation of the vehicle, k=N. At this moment:

$$X_{state}^{time}(N)=f(X_{state}(N-1),Q_{heat}(N),T_{amb}(N),T_{cool}(N))$$

Among them, the posteriori value of the second state vector value $X_{state}$ (N−1) (the posteriori value of the second state vector value can be obtained from the first moment, after performing multiple iterations on the initial state vector value), the third battery heat production rate $Q_{heat}(N)$ (at the $N^{th}$ moment when the vehicle actually runs, $Q_{heat}(N)=Q_{heat2N}$) the second cooling plate temperature $T_{cool}(N)$, and the second ambient temperature $T_{amb}(N)$ are all known. Therefore, a priori estimated value $X_{state}^{time}(N)$ of the second state vector at the $N^{th}$ moment can be obtained.

The estimated value of the second battery surface point temperature is determined according to a priori estimated value of the second state vector. That is, at the $N^{th}$ moment of the actual operation, k=N. At this moment, $Y^{mea}(N)=g(X_{state}^{time}(N))$, since $X_{state}^{time}(N)$ is known, a second estimated battery surface point temperature $Y^{mea}(N)$ at the $N^{th}$ moment can be calculated.

Inputting the priori estimated value of the second state vector, the second estimated battery surface point temperature, and the second battery surface temperature into the Luenberger observer, and obtaining the posteriori value of the second state vector after the Luenberger observer feedback correction, that is, at the $N^{th}$ moment when the vehicle actually s, k=N, 1≤i≤k. At this moment, it can be known from the above-mentioned Luenberger runs, observer:

$X_{state}(N) =$ $X_{state}^{time}(N) + K_p \cdot (T_s^{measure}(N) - Y^{mea}(N)) + K_1 \cdot \sum_{i=1}^{N}(T_s^{measure}(i) - Y^{mea}(i)).$ At this moment, the priori estimated value of the second state vector $X_{state}^{time}(N)$ at the $N^{th}$ moment is known; the second estimated battery surface point temperature $Y^{mea}(N)$ at the $N^{th}$ moment and the estimated battery surface point temperature $Y^{mea}$ (i) at the $i^{th}$ moment are both known; $K_p$ and $K_1$ are preset in the Luenberger observer; $T_s^{measure}(i)$ can be measured in real time by the fourth temperature sensing device arranged on the surface of the battery of the vehicle at the $i^{th}$ moment. At this moment, the posteriori value of the second state vector $X_{state}(N)$ of the battery of the vehicle at the $N^{th}$ moment can be calculated.

The second estimated battery internal temperature at the $N^{th}$ moment of the actual operation of the vehicle is determined, according to a posteriori value of the second state vector.

Understandably, N is a positive integer greater than or equal to 2. When N=2, the $(N-1)^{th}$ moment is the first moment. At this moment, the posteriori value of the second state vector at the $(N-1)^{th}$ moment in the above embodiment is the posteriori value of the first state vector corresponding to the first moment. If N is greater than 2, the iteration may be performed according to the above embodiment.

Figure 7:
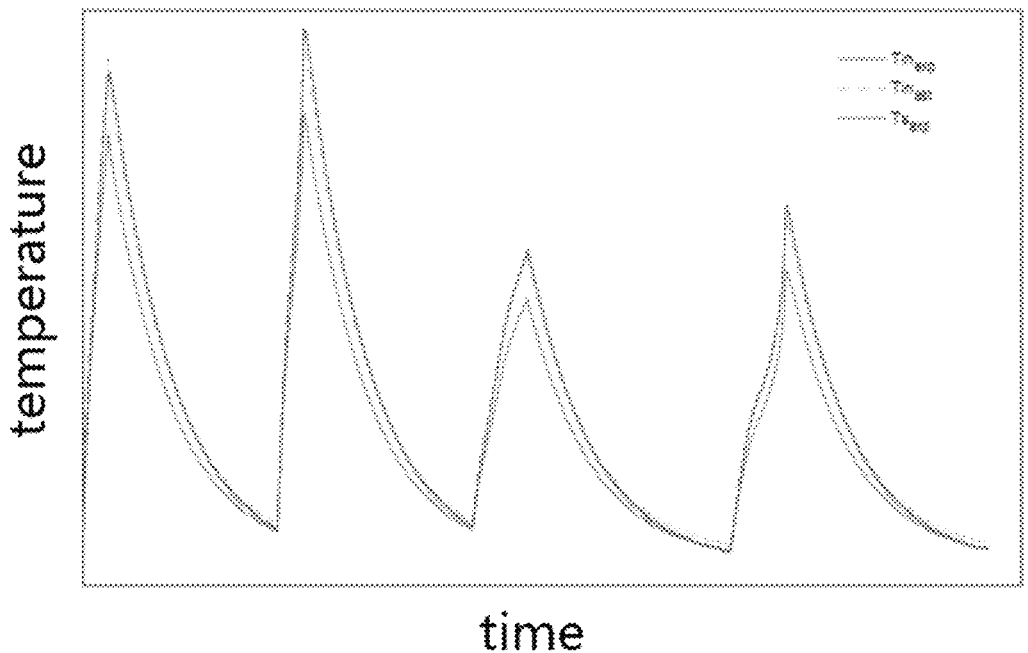
FIG. 7 is a schematic representation of experimental validation results in accordance with one embodiment of the present disclosure.

FIG. 7 shows the verification result of the experimental verification performed by the method for processing internal temperature information of the battery of the present disclosure. The verification object of the experimental verification is the cell of the battery module in which the first temperature sensing device is arranged. FIG. 7 shows the measured value of the internal temperature $T_{inexp}$ the battery cell, the surface temperature of the battery cell $T_{sexp}$ during the charging and discharging process at different rates and during the static process, and the estimated value of the internal temperature of the battery $T_{inest}$ corresponding to the battery cell of the battery module. The experimental results show that the error between the estimated value of the internal temperature of the battery of the present disclosure and the measured value is very small, and the present disclosure can realize accurate estimation of the temperature of each node.

Figure 8:
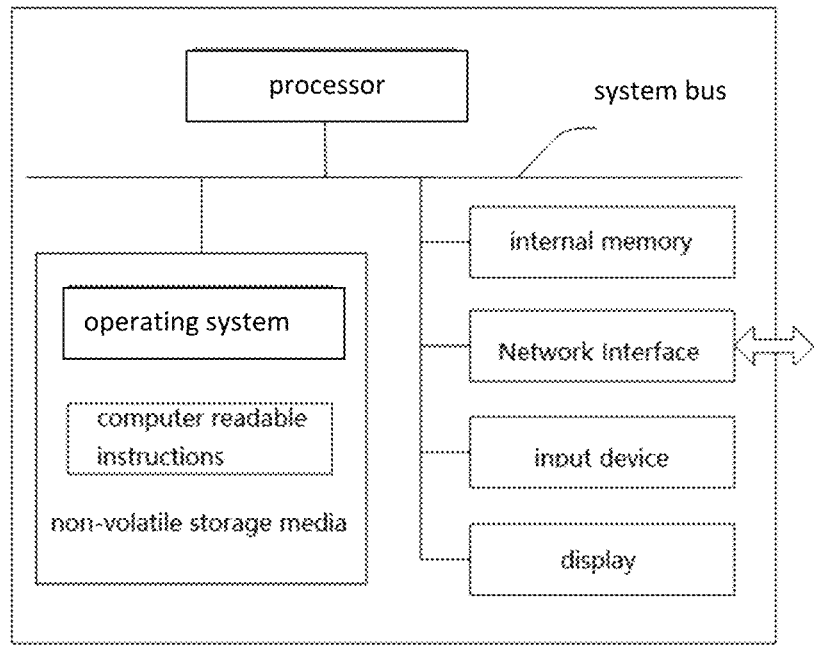
FIG. 8 is a schematic diagram of a computer device in accordance with an embodiment of the present disclosure.

Further, a computer device is provided, which may be a server, whose internal structure diagram may be as shown in FIG. 8. The computer device includes a processor, a memory, a network interface, and a database connected by a system bus. The processor of the computer device is configured to provide computing and control capabilities. The memory of the computer device includes non-volatile storage media, or an internal memory. The non-volatile storage medium stores an operating system, computer readable instructions, and a database. The internal memory provides an environment for execution of an operating system and computer-readable instructions in a non-volatile storage medium. The computer-readable instructions, when executed by a processor, implement a battery internal temperature information processing method.

Further, a computer device is provided, including a memory, a processor, and computer-readable instructions stored in the memory and executable on the processor, and the processor executing the computer-readable instructions to implement the battery internal temperature information processing method described above.

The present disclosure also provides a computer-readable storage medium storing computer-readable instructions that, when executed by a processor, implement the battery internal temperature information processing method described above.

The present disclosure also provides a vehicle including a battery and a control module communicatively connected to the battery, and the control module is configured to perform the battery internal temperature information processing method.

Regarding the definition of the control module, reference can be made to the definition of the above battery internal temperature information processing method, which is not repeated here. Each of the above-described control modules may be implemented in whole or in part by software, hardware, and combinations thereof. The above modules may be embedded in hardware or separate from a processor in the computer device, or may be stored in software in a memory in the computer device to facilitate the processor invocation to perform corresponding operations of the above modules.

Those of ordinary skill in the art will appreciate that all or part of the processes in implementing the above-described example processes, this may be accomplished by computer-readable instructions, which may be stored in a non-transitory computer-readable storage medium, that, when executed, may include a process according to an embodiment of the methods described above. Any references to memory, storage, databases, or other media, as used in various embodiments provided herein, may include non-volatile and/or volatile memory. Non-volatile memory can include read-only memory (ROM), programmable ROM (PROM), electrically programmable ROM (EPROM), electrically erasable programmable ROM (EEPROM), or flash memory. Volatile memory may include random access memory (RAM) or external cache memory. By way of illustration and not limitation, RAM is available in many forms such as static RAM (SRAM), dynamic RAM (DRAM), synchronous DRAM (SDRAM), double data rate SDRAM (DDRSDRAM), enhanced SDRAM (ESDRAM), Synchlink DRAM (SLDRAM), Memory Bus Direct RAM (RDRAM), Direct Memory Bus Dynamic RAM (DRDRAM), Memory Bus Dynamic RAM (RDRAM), and the like.

A person skilled in the art may clearly understand that, for convenience and brevity of description, by way of example only with the above-described division of functional units or modules, in practice, the above-described allocation of functions may be done by different functional units or modules, i.e. the internal structure of the device is divided into different functional units or modules, as required to fulfill all or part of the above-described functions.

In the description of the present disclosure, It needs to be understood that The terms "central", "longitudinal", "lateral", "length", "width", "thickness", "upper", "lower", "front", "back", "left", "right", "vertical", "horizontal", "top", "bottom", "inner", "outer", "clockwise", "counter-clockwise", "axial", "radial", "circumferential" and the like indicate an orientation or positional relationship based on that shown in the drawings. It is merely for ease of description of the disclosure and simplicity of description, it does not indicate or imply that the devices or elements referred to must have a particular orientation, be constructed and operate in a particular orientation, and therefore cannot be construed as limiting the present disclosure.

Furthermore, the terms "first" and "second" are used for descriptive purposes only and are not to be understood as indicating or implying relative importance or as implying a number of indicated technical features. Thus, features qualified as "first" and "second" may explicitly or implicitly include one or more such features. In the description of the present disclosure, "plurality" means two or more unless explicitly specifically defined otherwise.

In the present disclosure, unless otherwise expressly specified and limited, the terms "installed", "connected", "connected", "fixed" and other terms should be understood in a broad sense, for example, it may be a fixed connection or a detachable connection, or integrated; it can be a mechanical connection or an electrical connection; it can be a direct connection or an indirect connection through an intermediate medium, and it can be the internal connection of the two elements or the interaction relationship between the two elements. For those of ordinary skill in the art, the specific meanings of the above terms in the present disclosure can be understood according to specific situations.

In the present disclosure, unless expressly stated and limited otherwise, the first feature is the second feature "up" or "under" can be direct contact of the first and second features, or indirect contact of the first and second features through an intermediary. Also, the first feature being "above", "over" and "above" the second feature may mean that the first feature is directly above or obliquely above the second feature, or simply means that the first feature is level higher than the second feature. The first feature being "below", "below" and "below" the second feature may mean that the first feature is directly below or obliquely below the second feature, or simply means that the first feature has a lower level than the second feature.

In the description of this specification, reference is made to the terms "one embodiment", "some embodiments", the description of an "example," "specific example," or "some examples," etc. means that a particular feature, structure, material, or characteristic described in connection with the embodiment or example is included in at least one embodiment or example of the present disclosure. In this specification, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine and combine the different embodiments or examples described in this specification, as well as the features of the different embodiments or examples, without conflicting each other.

Although the embodiments of the present disclosure have been shown and described above, it should be understood that the above-described embodiments are exemplary and should not be construed as limitations of the present disclosure, and those of ordinary skill in the art may interpret the above-described embodiments within the scope of the present disclosure. Embodiments are subject to variations, modifications, substitutions and variations.

What is claimed is:

1. A method for processing battery internal temperature information, comprising:
    obtaining off-line testing data of a battery module subject to an off-line test under different off-line operating conditions in an environment having a constant temperature, by:
        obtaining off-line temperature data and equivalent circuit data of the battery module under the different off-line operating conditions for performing the off-line test, wherein the equivalent circuit data includes a battery terminal voltage value and a battery current value of the battery module;
    wherein the obtaining off-line temperature data comprises:
        disposing a first temperature sensing device inside a pole of a cell of the battery module and measuring an off-line internal temperature of the cell;

disposing second temperature sensing devices to surfaces of the cell and measuring off-line surface temperatures of the surfaces of the cell; and disposing a third temperature sensing device to a cooling plate of a cooling system connected to the battery module and measuring an off-line temperature of the cooling plate, wherein the first temperature sensing device, the second temperature sensing devices, and the third temperature sensing device are of a same type of sensing devices;

obtaining multiple sets of initial parameters of an equivalent thermal network model according to the off-line testing data, and determining a set of optimal model parameters among the sets of initial parameters of the equivalent thermal network model based on a multi-objective function fitting method;

obtaining an initial state vector value of a battery comprising the battery module of a vehicle and first operating data of the battery of the vehicle at a first moment during an actual operation of the vehicle;

determining an estimate of an internal temperature of the battery at the first moment according to the initial state vector value, the first operating data, and the equivalent thermal network model including the set of optimal model parameters of the actual operation, wherein after obtaining the off-line temperature data and the off-line testing data of the battery module, the method comprises:

obtaining a first open circuit voltage and a first temperature coefficient of the battery module from a database;

grouping and inputting the battery terminal voltage value, the battery current value, and the off-line internal temperature into a first heat production rate model, and obtaining a first battery heat production rate of the battery module output from the first heat production rate model under the different off-line operating conditions; wherein a set of a battery terminal voltage value, a battery current value, and an off-line internal temperature comprises the battery terminal voltage value, the battery current value, and the off-line internal temperature corresponding to a same moment under a same off-line operating condition.

2. The method according to claim 1, wherein the first heat production rate model is based on a formular of $$Q_{heat1} = (OCV(SOC_1) - U_1) \times I_{21} + I_1 T_1 \frac{dOCV}{dT}(SOC_1);$$

the $Q_{heat1}$ is the first battery heat production rate of the battery module under the different off-line operating conditions;

the $OCV(SOC_1)$ is the first open circuit voltage of the battery module;

the $U_1$ is the battery terminal voltage value of the battery module;

the $I_1$ is the battery current value of the battery module;

the $T_1$ is the off-line internal temperature; and the $$\frac{dOCV}{dT}(SOC_1)$$

is the first temperature coefficient of the battery module.

3. The method according to claim 1, wherein the obtaining the multiple sets of initial parameters of the equivalent thermal network model according to the off-line testing data, and determining the set of optimal model parameters among the sets of initial parameters of the equivalent thermal network model based on the multi-objective function fitting method comprises:

obtaining input data and output data of the equivalent thermal network model, and associating the input data with the output data corresponding to the same moment under the same off-line operating condition; wherein the input data includes the first battery heat production rate, the off-line cooling plate temperature, and an off-line ambient temperature, and the output data includes the off-line internal temperature and the off-line surface temperatures; and inputting the input data into the equivalent thermal network model, and taking the output data associated with the input data as an output of the equivalent thermal network model to obtain a set of initial parameters of the equivalent thermal network model; wherein the set of the initial parameters includes a first equivalent thermal capacity inside the cell of the battery module in the equivalent thermal network model, and a first thermal resistance from an inside of the cell to a cell surface point corresponding to a heat transfer path, a second thermal resistance from the cell surface point corresponding to the heat transfer path to the environment, and a second equivalent thermal capacity of the cell surface point corresponding to the heat transfer path; and the multi-objective function fitting method includes one or more of a least-squares algorithm, a genetic algorithm, or a particle swarm optimization algorithm.

4. The method according to claim 1, wherein the obtaining the initial state vector value of the battery comprising the battery module of the vehicle and the first operating data of the battery of the vehicle at the first moment during the actual operation of the vehicle comprises:

obtaining the initial state vector value of the battery at an initial moment of the actual operation from a database; and obtaining first operating data at a first moment of the actual operation, wherein the first operating data includes a first battery surface temperature, a first cooling plate temperature, a first ambient temperature, a first voltage value, and a first current value; the first battery surface temperature is measured by a fourth temperature sensing device provided on a battery surface of the vehicle, and the first cooling plate temperature is measured by a fifth temperature sensing device provided on a cooling plate of a cooling system connected to the battery of the vehicle; the first ambient temperature is an temperature of the environment at the first moment of the actual operation; the first voltage value is a voltage value of the battery of the vehicle at the first moment of the actual operation, and the first current value is a current value of the battery of the vehicle at the first moment of the actual operation.

5. The method according to claim 4, wherein the determining the estimate of the internal temperature of the battery at the first moment according to the initial state vector value, the first operating data, and the equivalent thermal network model including the set of optimal model parameters of the actual operation comprises:

obtaining a second open circuit voltage and a second temperature coefficient of the battery of the vehicle from the database;

inputting the first voltage value, the first current value, and the first battery surface temperature into a second heat production rate model, and obtaining a second battery heat production rate outputted by the second heat production rate model at the first moment of the actual operation;

inputting the initial state vector value, the second battery heat production rate the first cooling plate temperature, and the first ambient temperature into the equivalent thermal network model containing the set of optimal model parameters, and obtaining a priori estimated value of a first state vector of the battery of the vehicle at the first moment of the actual operation output by the equivalent thermal network model;

determining an estimated value of a first battery surface point temperature according to the priori estimated value of the first state vector;

inputting the priori estimated value of the first state vector, the estimated value of the first battery surface point temperature, and the first battery surface temperature into a Luenberger observer including a first gain value and a second gain value, and obtaining a posteriori value of the first state vector after feedback correction of the Luenberger observer; and determining a first estimated value of the internal temperature of the battery of the vehicle at the first moment of the actual operation according to the posteriori value of the first state vector.

6. The method according to claim 5, wherein after the determining the estimate of the internal temperature of the battery at the first moment according to the initial state vector value, the first operating data, and the equivalent thermal network model including the set of optimal model parameters of the actual operation, further comprising:

obtaining second operating data of the battery of the vehicle at an $N^{th}$ moment of the actual operation and a posteriori value of a second state vector at an $(N-1)^{th}$ moment; wherein N is a positive integer greater than or equal to 2; and determining a second estimated value of the internal temperature of the battery at the $N^{th}$ moment of the actual operation according to the posteriori value of the second state vector at the $(N-1)^{th}$ moment, the second operating data, and the equivalent thermal network model including the set of optimal model parameters at the $N^{th}$ moment.

7. The method according to claim 6, wherein the second operating data comprises a second battery surface temperature, a second cooling plate temperature, a second ambient temperature, a second voltage value, and a second current value; a second battery surface temperature is measured by the fourth temperature sensing device; the second cooling plate temperature is measured by the fifth temperature sensing device; the second ambient temperature is the temperature of the environment at the $N^{th}$ moment of the actual operation; the second voltage value is the voltage value of the battery of the vehicle at the $N^{th}$ moment of the actual operation; and the second current value is a current value of the battery of the vehicle at the $N^{th}$ moment of the actual operation.

8. The method according to claim 7, wherein the determining the second estimated value of the internal temperature of the battery at the $N^{th}$ moment of the actual operation according to the posteriori value of the second state vector at the $(N-1)^{th}$ moment, the second operating data, and the equivalent thermal network model including the set of optimal model parameters at the $N^{th}$ moment, comprises:

inputting the second voltage value, the second current value, and the second battery surface temperature into the second heat production rate model, and obtaining a third battery heat production rate of the battery of the vehicle output from the second heat production rate model at the $N^{th}$ moment of the actual operation;

inputting the posteriori value of the second state vector at the $(N-1)^{th}$ moment, the third battery heat production rate, the second cooling plate temperature, and the second ambient temperature into the equivalent thermal network model including the set of optimal model parameters, and obtaining a priori estimated value of the second state vector of the battery of the vehicle at the $N^{th}$ moment of actual operation output by the equivalent thermal network model;

determining a second estimated battery surface point temperature based on the priori estimated value of the second state vector;

inputting the priori estimated value of the second state vector, the estimated second battery surface point temperature, and the second battery surface temperature into the Luenberger observer, and obtaining a posteriori value of the second state vector after feedback correction of the Luenberger observer;

determining a second estimated value of the internal temperature of the battery at the $N^{th}$ moment of the actual operation of the vehicle according to the posteriori value of the second state vector.

9. The method according to claim 5, wherein the second heat production rate model is based on a formula of $$Q_{heat2k} = (OCV(SOC_{2k}) - U_{2k}) \times I_{2k} + I_{2k} T_{2k} \frac{dOCV}{dT}(SOC_{2k}),$$

the k is a $k^{th}$ moment of the actual operation of the battery of the vehicle, $0 \leq k \leq N$ and the k is an integer; at the initial moment of the actual operation of the vehicle, k=0; at the first moment of the actual operation of the vehicle, k=1; at an $N^{th}$ moment of the actual operation of the vehicle, k=N;

the $Q^{heat2k}$ is the second battery heat production rate of the battery of the vehicle at $k^{th}$ moment;

the $OCV(SOC_{2k})$ is the second open circuit voltage of the battery of the vehicle;

the $U_{2k}$ is a second voltage value of the battery of the vehicle at $k^{th}$ moment; and the $I_{2k}$ is a second current value of the battery of the vehicle at the $k^{th}$ moment;

the $T_{2k}$ is a second battery surface temperature of the battery of the vehicle at $k^{th}$ moment; and the $$\frac{dOCV}{dT}(SOC_{2k})$$

is the second temperature coefficient of the battery of the vehicle.

10. The method according to claim 5, wherein the Luenberger observer is based on a formula of $$X_{state}(k) = X_{state}^{time}(k) + K_p \cdot (T_s^{measure}(k) - Y^{mea}(k)) + K_1 \cdot \sum_{i=1}^{k}(T_s^{measure}(i) - Y^{mea}(i)),$$

k is a $k^{th}$ moment of the actual operation of the battery of the vehicle, $0 \leq k \leq N$, and the k is an integer; at the initial moment of the actual operation of the vehicle, k=0; at the first moment of the actual operation of the vehicle, k=1; at an $N^{th}$ moment of the actual operation of the vehicle, k=N;

the $X_{state}(k)$ is a posteriori value of a state vector of the battery of the vehicle at the $k^{th}$ moment;

the $X_{state}^{time}(k)$ is a priori estimated value of the state vector of the battery of the vehicle at the $k^{th}$ moment;

the $K_p$ is the first gain value;

the $K_1$ is the second gain value;

the $T_s^{measure}(k)$ is a second battery surface temperature of the vehicle at the $k^{th}$ moment;

$Y^{mea}(k)$ is a second estimated battery surface point temperature of the vehicle at the $k^{th}$ the moment;

the $T_s^{measure}(i)$ is a battery surface temperature of the vehicle at an $i^{th}$ moment, the $1 \leq l \leq k$, and the i is an integer; and the $Y^{mea}(i)$ is an estimated battery surface point temperature of the vehicle at the $i^{th}$ moment.

11. A device for processing battery internal temperature information comprising a memory, a processor, and computer-readable instructions stored in the memory and executable on the processor, wherein the processor executes the computer-readable instructions to operations comprising:

obtaining off-line testing data of a battery module subject to an off-line test under different off-line operating conditions in an environment having a constant temperature, by:

obtaining off-line temperature data and equivalent circuit data of the battery module under the different off-line operating conditions for performing the off-line test, wherein the equivalent circuit data includes a battery terminal voltage value and a battery current value of the battery module;

wherein the obtaining off-line temperature data comprises:

disposing a first temperature sensing device inside a pole of a cell of the battery module and measuring an off-line internal temperature of the cell;

disposing second temperature sensing devices to surfaces of the cell and measuring off-line surface temperatures of the surfaces of the cell; and disposing a third temperature sensing device to a cooling plate of a cooling system connected to the battery module and measuring an off-line temperature of the cooling plate, wherein the first temperature sensing device, the second temperature sensing devices, and the third temperature sensing device are of a same type of sensing devices;

obtaining multiple sets of initial parameters of an equivalent thermal network model according to the off-line testing data, and determining a set of optimal model parameters among the sets of initial parameters of the equivalent thermal network model based on a multi-objective function fitting method;

obtaining an initial state vector value of a battery comprising the battery module of a vehicle and first operating data of the battery of the vehicle at a first moment during an actual operation of the vehicle;

determining an estimate of an internal temperature of the battery at the first moment according to the initial state vector value, the first operating data, and the equivalent thermal network model including the set of optimal model parameters of the actual operation, wherein after obtaining the off-line temperature data and the off-line testing data of the battery module, the method comprises:

obtaining a first open circuit voltage and a first temperature coefficient of the battery module from a database;

grouping and inputting the battery terminal voltage value, the battery current value, and the off-line internal temperature into a first heat production rate model, and obtaining a first battery heat production rate of the battery module output from the first heat production rate model under the different off-line operating conditions; wherein a set of a battery terminal voltage value, a battery current value, and an off-line internal temperature comprises the battery terminal voltage value, the battery current value, and the off-line internal temperature corresponding to a same moment under a same off-line operating condition.

12. A non-transitory computer readable storage medium storing computer-readable instructions, wherein when the computer-readable instructions are executed by a processor, the processor is caused to perform operations comprising:

obtaining off-line testing data of a battery module subject to an off-line test under different off-line operating conditions in an environment having a constant temperature, by:

obtaining off-line temperature data and equivalent circuit data of the battery module under the different off-line operating conditions for performing the off-line test, wherein the equivalent circuit data includes a battery terminal voltage value and a battery current value of the battery module;

wherein the obtaining off-line temperature data is obtained by:

disposing a first temperature sensing device inside a pole of a cell of the battery module and measuring an off-line internal temperature of the cell;

disposing second temperature sensing devices to surfaces of the cell and measuring off-line surface temperatures of the surfaces of the cell; and disposing a third temperature sensing device to a cooling plate of a cooling system connected to the battery module and measuring an off-line temperature of the cooling plate, wherein the first temperature sensing device, the second temperature sensing devices, and the third temperature sensing device are of a same type of sensing devices;

obtaining multiple sets of initial parameters of an equivalent thermal network model according to the off-line testing data, and determining a set of optimal model parameters among the sets of initial parameters of the equivalent thermal network model based on a multi-objective function fitting method;

obtaining an initial state vector value of a battery comprising the battery module of a vehicle and first operating data of the battery of the vehicle at a first moment during an actual operation of the vehicle;

determining an estimate of an internal temperature of the battery at the first moment according to the initial state vector value, the first operating data, and the equivalent thermal network model including the set of optimal model parameters of the actual operation, wherein after obtaining the off-line temperature data and the off-line testing data of the battery module, the method comprises:

obtaining a first open circuit voltage and a first temperature coefficient of the battery module from a database;

grouping and inputting the battery terminal voltage value, the battery current value, and the off-line internal temperature into a first heat production rate model, and obtaining a first battery heat production rate of the battery module output from the first heat production rate model under the different off-line operating conditions; wherein a set of a battery terminal voltage value, a battery current value, and an off-line internal temperature comprises the battery terminal voltage value, the battery current value, and the off-line internal temperature corresponding to a same moment under a same off-line operating condition.

13. The device according to claim 11, wherein the first heat production rate model is based on a formular of $$Q_{heat1} = (OCV(SOC_1) - U_1) \times I_1 + I_1 T_1 \frac{dOCV}{dT}(SOC_1);$$

the $Q_{heat1}$ is the first battery heat production rate of the battery module under the different off-line operating conditions;

the $OCV(SOC_1)$ is the first open circuit voltage of the battery module;

the $U_1$ is the battery terminal voltage value of the battery module;

the $I_1$ is the battery current value of the battery module;

the $T_1$ is the off-line internal temperature; and the $$\frac{dOCV}{dT}(SOC_1)$$

is the first temperature coefficient of the battery module.

14. The device according to claim 11, wherein the obtaining the multiple sets of initial parameters of the equivalent thermal network model according to the off-line testing data, and determining the set of optimal model parameters among the sets of initial parameters of the equivalent thermal network model based on the multi-objective function fitting method comprises:

obtaining input data and output data of the equivalent thermal network model, and associating the input data with the output data corresponding to the same moment under the same off-line operating condition; wherein the input data includes the first battery heat production rate, the off-line cooling plate temperature, and an off-line ambient temperature, and the output data includes the off-line internal temperature and the off-line surface temperatures; and inputting the input data into the equivalent thermal network model, and taking the output data associated with the input data as an output of the equivalent thermal network model to obtain a set of initial parameters of the equivalent thermal network model; wherein the set of the initial parameters includes a first equivalent thermal capacity inside the cell of the battery module in the equivalent thermal network model, and a first thermal resistance from an inside of the cell to a cell surface point corresponding to a heat transfer path, a second thermal resistance from the cell surface point corresponding to the heat transfer path to the environment, and a second equivalent thermal capacity of the cell surface point corresponding to the heat transfer path; and the multi-objective function fitting method includes one or more of a least-squares algorithm, a genetic algorithm, or a particle swarm optimization algorithm.

15. The device according to claim 11, wherein the obtaining the initial state vector value of the battery comprising the battery module of the vehicle and the first operating data of the battery of the vehicle at the first moment during the actual operation of the vehicle comprises:

obtaining the initial state vector value of the battery at an initial moment of the actual operation from a database; and obtaining first operating data at a first moment of the actual operation, wherein the first operating data includes a first battery surface temperature, a first cooling plate temperature, a first ambient temperature, a first voltage value, and a first current value; the first battery surface temperature is measured by a fourth temperature sensing device provided on a battery surface of the vehicle, and the first cooling plate temperature is measured by a fifth temperature sensing device provided on a cooling plate of a cooling system connected to the battery of the vehicle; the first ambient temperature is an temperature of the environment at the first moment of the actual operation; the first voltage value is a voltage value of the battery of the vehicle at the first moment of the actual operation, and the first current value is a current value of the battery of the vehicle at the first moment of the actual operation.

16. The device according to claim 15, wherein the determining the estimate of the internal temperature of the battery at the first moment according to the initial state vector value, the first operating data, and the equivalent thermal network model including the set of optimal model parameters of the actual operation comprises:

obtaining a second open circuit voltage and a second temperature coefficient of the battery of the vehicle from the database;

inputting the first voltage value, the first current value, and the first battery surface temperature into a second heat production rate model, and obtaining a second battery heat production rate outputted by the second heat production rate model at the first moment of the actual operation;

inputting the initial state vector value, the second battery heat production rate the first cooling plate temperature, and the first ambient temperature into the equivalent thermal network model containing the set of optimal model parameters, and obtaining a priori estimated value of a first state vector of the battery of the vehicle at the first moment of the actual operation output by the equivalent thermal network model;

determining an estimated value of a first battery surface point temperature according to the priori estimated value of the first state vector;

inputting the priori estimated value of the first state vector, the estimated value of the first battery surface point temperature, and the first battery surface temperature into a Luenberger observer including a first gain value and a second gain value, and obtaining a posteriori value of the first state vector after feedback correction of the Luenberger observer; and determining a first estimated value of the internal temperature of the battery of the vehicle at the first moment of the actual operation according to the posteriori value of the first state vector.

17. The device according to claim 16, wherein after the determining the estimate of the internal temperature of the battery at the first moment according to the initial state vector value, the first operating data, and the equivalent thermal network model including the set of optimal model parameters of the actual operation, the operations further comprise:

obtaining second operating data of the battery of the vehicle at an $N^{th}$ moment of the actual operation and a posteriori value of a second state vector at an $(N-1)^{th}$ moment; wherein N is a positive integer greater than or equal to 2; and determining a second estimated value of the internal temperature of the battery at the $N^{th}$ moment of the actual operation according to the posteriori value of the second state vector at the $(N-1)^{th}$ moment, the second operating data, and the equivalent thermal network model including the set of optimal model parameters at the $N^{th}$ moment.

18. The device according to claim 17, wherein the second operating data comprises a second battery surface temperature, a second cooling plate temperature, a second ambient temperature, a second voltage value, and a second current value; a second battery surface temperature is measured by the fourth temperature sensing device; the second cooling plate temperature is measured by the fifth temperature sensing device; the second ambient temperature is the temperature of the environment at the $N^{th}$ moment of the actual operation; the second voltage value is the voltage value of the battery of the vehicle at the $N^{th}$ moment of the actual operation; and the second current value is a current value of the battery of the vehicle at the $N^{th}$ moment of the actual operation.

19. The device according to claim 18, wherein the determining the second estimated value of the internal temperature of the battery at the $N^{th}$ moment of the actual operation according to the posteriori value of the second state vector at the $(N-1)^{th}$ moment, the second operating data, and the equivalent thermal network model including the set of optimal model parameters at the $N^{th}$ moment, comprises:

inputting the second voltage value, the second current value, and the second battery surface temperature into the second heat production rate model, and obtaining a third battery heat production rate of the battery of the vehicle output from the second heat production rate model at the $N^{th}$ moment of the actual operation;

inputting the posteriori value of the second state vector at the $(N-1)^{th}$ moment, the third battery heat production rate, the second cooling plate temperature, and the second ambient temperature into the equivalent thermal network model including the set of optimal model parameters, and obtaining a priori estimated value of the second state vector of the battery of the vehicle at the $N^{th}$ moment of actual operation output by the equivalent thermal network model;

determining a second estimated battery surface point temperature based on the priori estimated value of the second state vector;

inputting the priori estimated value of the second state vector, the estimated second battery surface point temperature, and the second battery surface temperature into the Luenberger observer, and obtaining a posteriori value of the second state vector after feedback correction of the Luenberger observer;

determining a second estimated value of the internal temperature of the battery at the $N^{th}$ moment of the actual operation of the vehicle according to the posteriori value of the second state vector.

20. The device according to claim 16, wherein the second heat production rate model is based on a formula of $$Q_{heat2k} = (OCV(SOC_{2k}) - U_{2k}) \times I_{2k} + I_{2k} T_{2k} \frac{dOCV}{dT}(SOC_{2k}),$$

the k is a $k^{th}$ moment of the actual operation of the battery of the vehicle, $0 \leq k \leq N$, and the k is an integer; at the initial moment of the actual operation of the vehicle, k=0; at the first moment of the actual operation of the vehicle, k=1; at an $N^{th}$ moment of the actual operation of the vehicle, k=N;

the $Q_{heat2k}$ is the second battery heat production rate of the battery of the vehicle at $k^{th}$ moment;

the $OCV(SOC_{2k})$ is the second open circuit voltage of the battery of the vehicle;

the $U_{2k}$ is a second voltage value of the battery of the vehicle at $k^{th}$ moment; and the $I_{2k}$ is a second current value of the battery of the vehicle at the $k^{th}$ moment;

the $T_{2k}$ is a second battery surface temperature of the battery of the vehicle at $k^{th}$ moment; and the $$\frac{dOCV}{dT}(SOC_{2k})$$

the is the second temperature coefficient of the battery of the vehicle.

* * * * *

UNITED STATES PATENT AND TRADEMARK OFFICE
CERTIFICATE OF CORRECTION

PATENT NO. : 12,222,396 B2
APPLICATION NO. : 17/780911
DATED : February 11, 2025
INVENTOR(S) : Linwang Deng et al.

It is certified that error appears in the above-identified patent and that said Letters Patent is hereby corrected as shown below:

In the Specification

In Column 14, Line 45, that reads
"$X_{state}^{time}(1) = fX_{state}(0), Q_{heat}(1), T_{amb}(1), T_{cool}(1))$," should read
— $X_{state}^{time}(1) = f(X_{state}(0), Q_{heat}(1), T_{amb}(1), T_{cool}(1))$ —

In Column 15, Line 32, that reads "$T_s^{measure}$" should read — $T_s^{measure}(i)$ —

In Column 17, Line 58, that reads "actually s," should read — actually runs —

In the Claims

In Column 21, Line 50, Claim 2, that reads
"$Q_{heat1} = (OCV(SOC_1) - U_1) \times I_{21} + I_1 T_1 \frac{dOCV}{dT}(SOC_1)$," should read
— $Q_{heat1} = (OCV(SOC_1) - U_1) \times I_1 + I_1 T_1 \frac{dOCV}{dT}(SOC_1)$ —

In Column 25, Line 11, Claim 10, that reads "the vehicle, O≤k≤N" should read — the vehicle, 0≤k≤N —

In Column 25, Line 28, Claim 10, that reads "the 1≤1≤k" should read — the 1≤i≤k —

Signed and Sealed this
Twenty-seventh Day of May, 2025

Coke Morgan Stewart
*Acting Director of the United States Patent and Trademark Office*